United States Patent
Ueda et al.

(10) Patent No.: US 6,405,094 B1
(45) Date of Patent: Jun. 11, 2002

(54) APPARATUS AND METHOD OF COLLECTING SUBSTRATES ABNORMALLY PROCESSED OR PROCESSED PREVIOUS TO ORDINARY PROCESSING

(75) Inventors: Issei Ueda, Kumamoto; Tadayuki Yamaguchi, Atsugi; Yoshitaka Hara, Kumamoto, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/349,097

(22) Filed: Jul. 8, 1999

(30) Foreign Application Priority Data

Jul. 10, 1998  (JP) .......................................... 10-195580

(51) Int. Cl.[7] .............................................. G06F 19/00
(52) U.S. Cl. ........................ 700/112; 700/108; 700/121
(58) Field of Search ................................ 700/108, 109, 700/110, 112, 114, 121, 213, 214, 219; 414/937, 940

(56) References Cited

U.S. PATENT DOCUMENTS

| | | | | |
|---|---|---|---|---|
| 5,898,588 A | * | 4/1999 | Morimoto | ................... 700/108 |
| 5,923,553 A | * | 7/1999 | Yi | ............................... 700/110 |
| 5,955,857 A | * | 9/1999 | Kwon et al. | ........... 318/568.11 |
| 6,012,966 A | * | 1/2000 | Ban et al. | ....................... 451/8 |
| 6,035,245 A | * | 3/2000 | Conboy et al. | ............. 700/214 |
| 6,129,496 A | * | 10/2000 | Iwasaki et al. | ........ 414/222.01 |
| 6,131,052 A | * | 10/2000 | Ban et al. | ................... 700/121 |
| 6,162,010 A | * | 12/2000 | Ishizawa et al. | ............ 414/805 |

FOREIGN PATENT DOCUMENTS

| | | | | |
|---|---|---|---|---|
| JP | 62263646 | * | 11/1987 | ........... H01L/21/66 |
| JP | 09252035 | * | 9/1997 | ........... H01L/21/66 |

* cited by examiner

*Primary Examiner*—Leo Picard
*Assistant Examiner*—Ryan Jarrett
(74) *Attorney, Agent, or Firm*—Rader, Fishman & Grauer, PLLC

(57) ABSTRACT

A second mounting section housing a plurality of substrates abnormally processed in a process section and a plurality of substrates processed previous to ordinary processing therein is provided in addition to a first mounting section housing a plurality of substrates before and after processing. Abnormally processed substrates or previously processed substrates are collected in the second mounting section. Thus, the abnormally processed substrates can be exactly taken out and subjected to inspection and the like, and the substrates processed previous to ordinary processing can be exactly taken out and subjected to inspection and the like.

16 Claims, 7 Drawing Sheets

APPARATUS AND METHOD OF COLLECTING SUBSTRATES ABNORMALLY PROCESSED OR PROCESSED PREVIOUS TO ORDINARY PROCESSING

BACKGROUND OF THE INVENTION

1. Field of the Invention

The present invention relates to an apparatus and a method for coating a substrate such as a semiconductor wafer, an LCD substrate, or the like with a resist and developing it.

2. Description of the Related Art

In the photo-resist process among semiconductor device fabrication processes, a resist solution is coated on the surface of a semiconductor wafer (hereinafter referred to as "a wafer") to form a resist film thereon. After a predetermined pattern is exposed on the resist film, a developing solution is applied to the substrate to be fabricated and the substrate is developed. Conventionally such resist-coating processing and developing processing are performed by a processing system in which a plurality of processing units are integrated and a substrate is transferred between the units by a transfer device. The transfer of substrates to/from the processing system is performed by a mounting section housing a plurality of substrates.

The processing units in the aforesaid processing system are spinner-type resist coating unit and developing unit, a heating unit, a cooling unit, and the like. A wafer housed in the mounting section is carried into and out of these processing units by the transfer device and again housed in the mounting section.

In the processing system configured as above, in some cases, a wafer is not normally processed, that is, a wafer is abnormally processed in the above processing units. For instance, the supply of a solution is accidentally stopped in the resist coating unit or the developing unit, the wafer is not mounted at a normal position, or notice of abnormal processing is given from an aligner side. In such cases, in order not to waste an expensive wafer, it is required to inspect whether the abnormally processed wafer can be advanced to the subsequent step and handled similarly to a normally processed wafer, and to continue the processing when the wafer can be handled similarly.

In the above inspection, for example, abnormally processed wafers are selected out of a plurality of wafers which have undergone processing and are housed in a mounting section, and the selected wafers are transferred to an inspection device.

Wafers which are judged by the inspection device as to be handled similarly to normally processed wafers are returned again to the mounting section. The other wafers undergo surface peeling and are reprocessed from the beginning, or are abandoned.

However, there are disadvantages that the selection of abnormally processed wafers out of a plurality of wafers which have undergone processing and are housed in the mounting section takes time and labor, and that when the wafers are not exactly selected, the subsequent processing for the wafers is wasted. Especially in a processing system having a plurality of mounting sections, abnormally processed wafers are dispersed in respective mounting sections, in which case it is not easy to exactly select the abnormally processed wafers.

SUMMARY OF THE INVENTION

An object of the present invention is to provide a substrate processing apparatus and a substrate processing method in which abnormally processed wafers can be exactly taken out and subjected to inspection and the like.

Another object of the present invention is to provide a substrate processing apparatus and a substrate processing method in which substrates processed previous to ordinary processing can be exactly taken out and subjected to inspection and the like.

To attain these objects, the present invention is a substrate processing apparatus including a first mounting section housing a plurality of substrates before and after processing, a process section processing the substrate, a second mounting section housing a plurality of the substrates abnormally processed in the process section or a plurality of the substrates processed previous to ordinary processing therein, and means for transferring the substrate between the first mounting section, the process section, and the second mounting section.

In the present invention, the second mounting section housing a plurality of substrates abnormally processed in the process section and a plurality of substrates processed previous to ordinary processing therein is provided in addition to the first mounting section housing a plurality of substrates before and after processing, and abnormally processed substrates or previously processed substrates are collected in the second mounting section. Thus, the abnormally processed substrates can be exactly taken out and subjected to inspection and the like, and the substrates processed previous to ordinary processing can be exactly taken out and subjected to inspection and the like.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
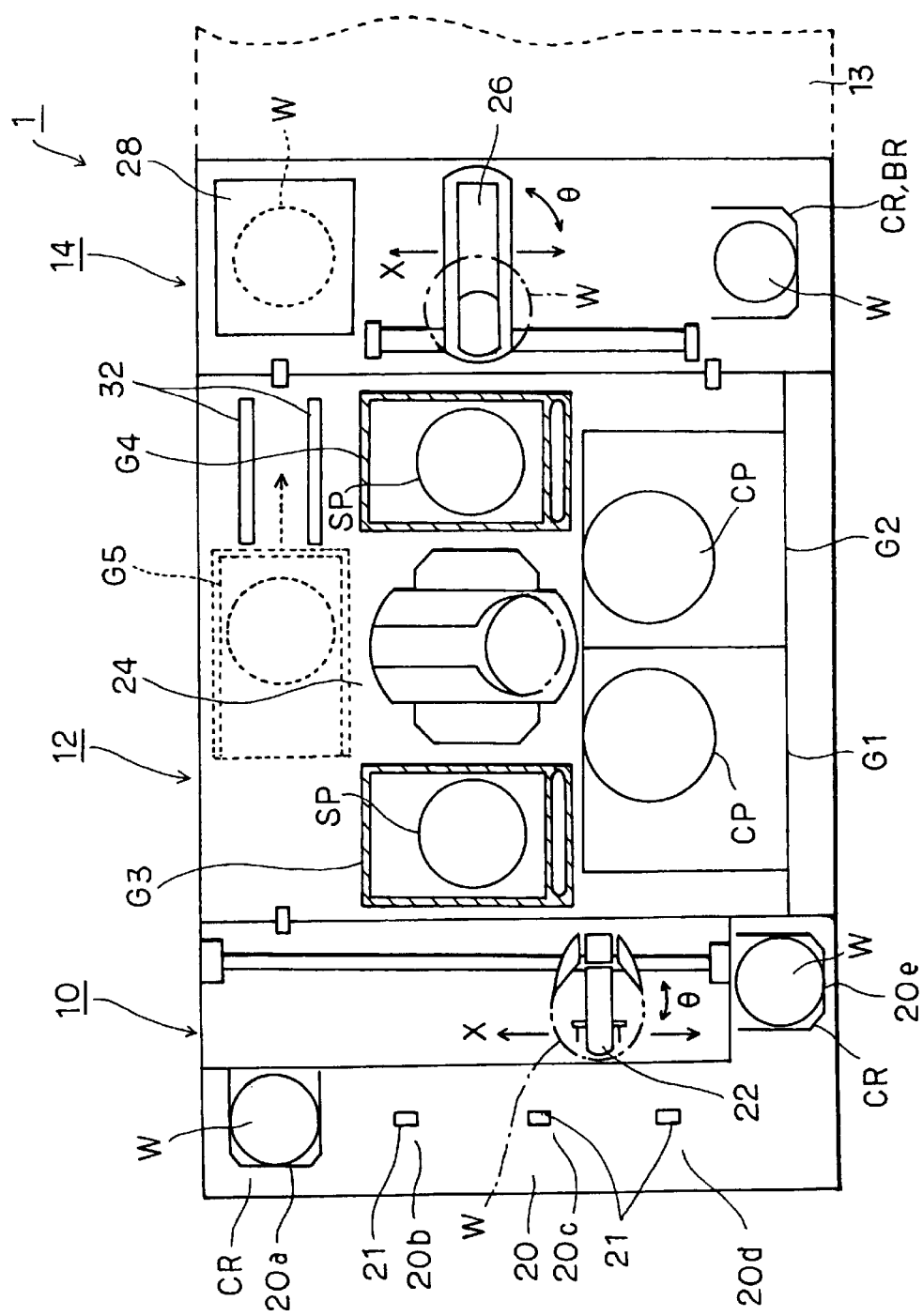
FIG. 1 is a plane view showing the configuration of a coating and developing system according to an embodiment of the present invention.

As shown in FIG. 1, in a coating and developing system 1, a mounting section station 10 for transferring a plurality of wafers W as substrates to be processed, for example, 25 wafers per mounting section while being housed in a wafer mounting section CR as substrate housing means from/to the outside to/from the system and for carrying the wafer W into/out of the wafer mounting section CR, a process station 12 in which various processing units as substrate processing means for applying predetermined processing to the wafers W one by one in the coating and developing process are multi-tiered at predetermined positions, and an interface section 14 for sending and receiving the wafer W to/from an aligner 13 arranged adjacent to the coating and developing system 1 are integrally connected.

In the mounting section station 10, a mounting table 20 with an L-shaped mounting surface is provided, and positioning projections 21 are provided on the mounting surface of the mounting table 20. The wafer mounting section CR is mounted while positioned at the point of each positioning projection 21. At the positions of the positioning projections 21, mounting sections 20a to 20e are respectively formed. A censor not shown for detecting the presence or absence of the wafer mounting section CR is provided in each of the mounting sections 20a to 20e where the wafer mounting section CR is mounted.

In the mounting table 20, five mounting sections 20a to 20e are provided, and up to five wafer mounting sections CR can be mounted.

Four wafer mounting sections CR out of these five mounting sections are mounted in a line in an X-direction on the mounting sections 20a to 20d with respective wafer transfer ports facing the side of the process station 12. The remaining one is arranged on the mounting section 20e at 90 degrees from the above four wafer mounting sections CR, on the front side of the coating and developing system 1 with a transfer port thereof facing the rear side of the coating and developing system 1. It should be mentioned that the number and arrangement of the mounting sections are not limited to the aforesaid ones. For example, the number of the mounting sections may be six or more, or four or less, and the mounting sections may be provided in a line instead of in the form of L.

In the mounting section station 10 is provided a wafer transfer mechanism 22 movable in a direction of arrangement of mounting sections (X-direction) and in a direction of arrangement of the wafers W housed in the wafer mounting section CR (Z-direction: vertical direction) and rotatable in a θ-direction. The wafer transfer mechanism 22 is structured to be selectively accessible to each wafer mounting section CR and accessible to an alignment unit (ALIM) and an extension unit (EXT) disposed in multi-tiered units of a third processing unit group $G_3$ on the process station 12 side to transfer the wafer W as described later.

The four wafer mounting sections CR mounted on the mounting sections 20a to 20d arranged in a line in the X-direction out of the aforesaid five wafer mounting sections CR house unprocessed wafers W and processed wafers W. When ordinary processing in main processing is performed, an unprocessed wafer W is taken out of any of these four wafer mounting sections CR and an processed wafer W is housed in any of the four wafer mounting sections CR. In this case, the processed wafer can be returned to the original wafer mounting section CR (the wafer mounting section CR where the wafer W is housed before processing).

The remaining one wafer mounting section CR provided on the mounting section 20e on the front side is a collection mounting section for collecting wafers W abnormally processed and the wafers W processed previous to ordinary processing in the process station 12 and the aligner 13 both as a process section.

The aforesaid previous processing performed prior to ordinary processing is performed to confirm the conditions of processing prior to the ordinary processing. After the previous processing, the collection mounting section is taken out and the processing conditions of the wafers W housed therein which have completed the previous processing are confirmed. After it is confirmed that the processing of the wafers W is satisfactorily performed, ordinary processing is performed, thereby preventing many wafers W from being poorly processed.

In the process station 12, a vertical transfer-type main wafer transfer mechanism 24 including a wafer transfer device is provided, and all processing units of one group or divided into plural groups are multi-tiered around the main wafer transfer mechanism 24.

Figure 2:
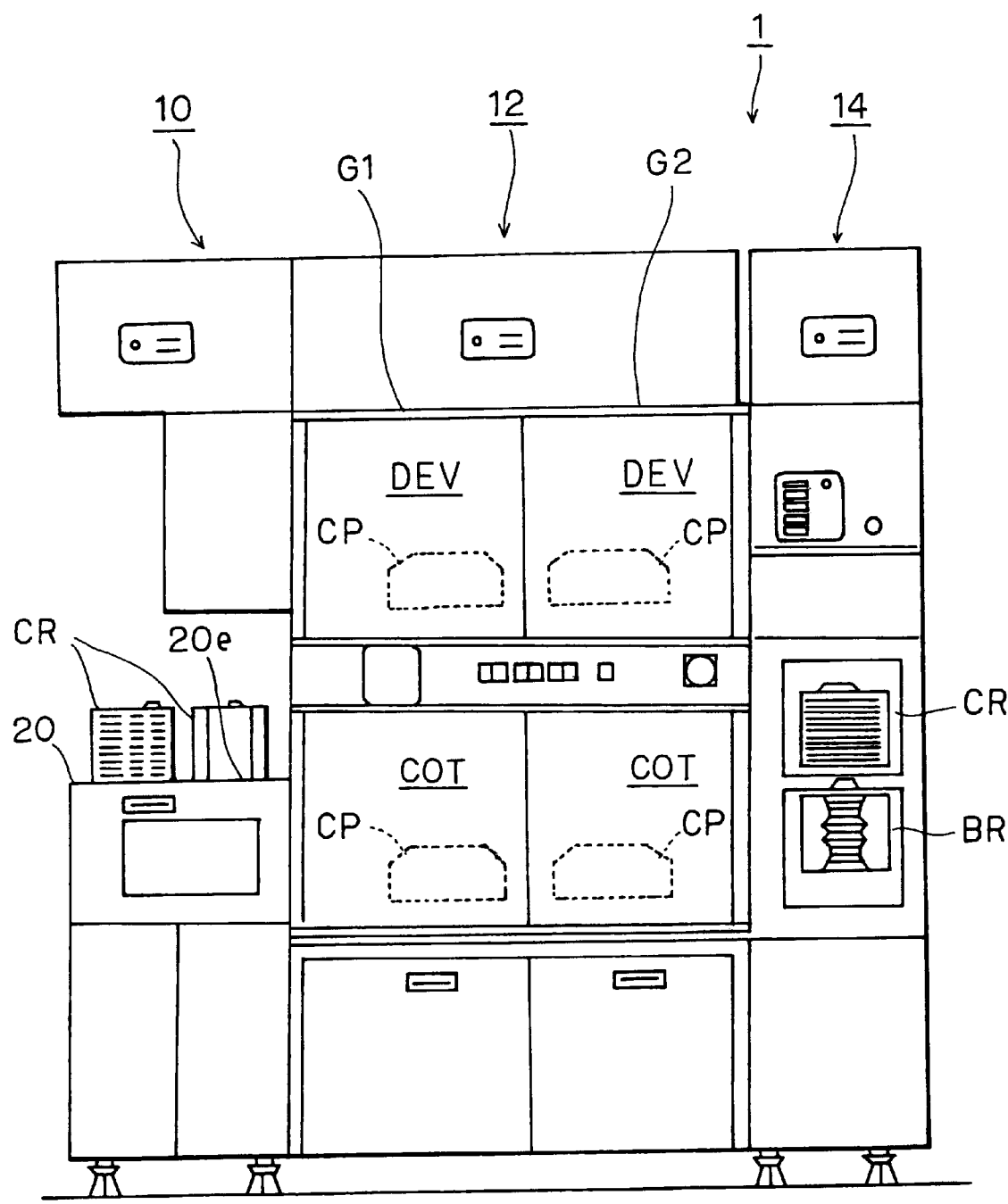
FIG. 2 is a front view of the coating and developing system shown in FIG. 1.

As shown in FIG. 2, in a first processing unit group $G_1$, two spinner-type processing units in which the wafer W is put on a spin chuck in a cup CP to perform predetermined processing, for example, a resist coating unit (COT) and a developing unit (DEV) are two-tiered from the bottom in order. In a second processing unit group $G_2$, two spinner-type processing units, for example, a resist coating unit (COT) and a developing unit (DEV) are two-tiered from the bottom in order. It is preferable to arrange these resist coating units (COT) at the lower stage as described above since drainage of a resist solution is troublesome in terms of mechanism and maintenance. However, it is naturally possible to properly arrange them at the upper stage as required.

Figure 3:
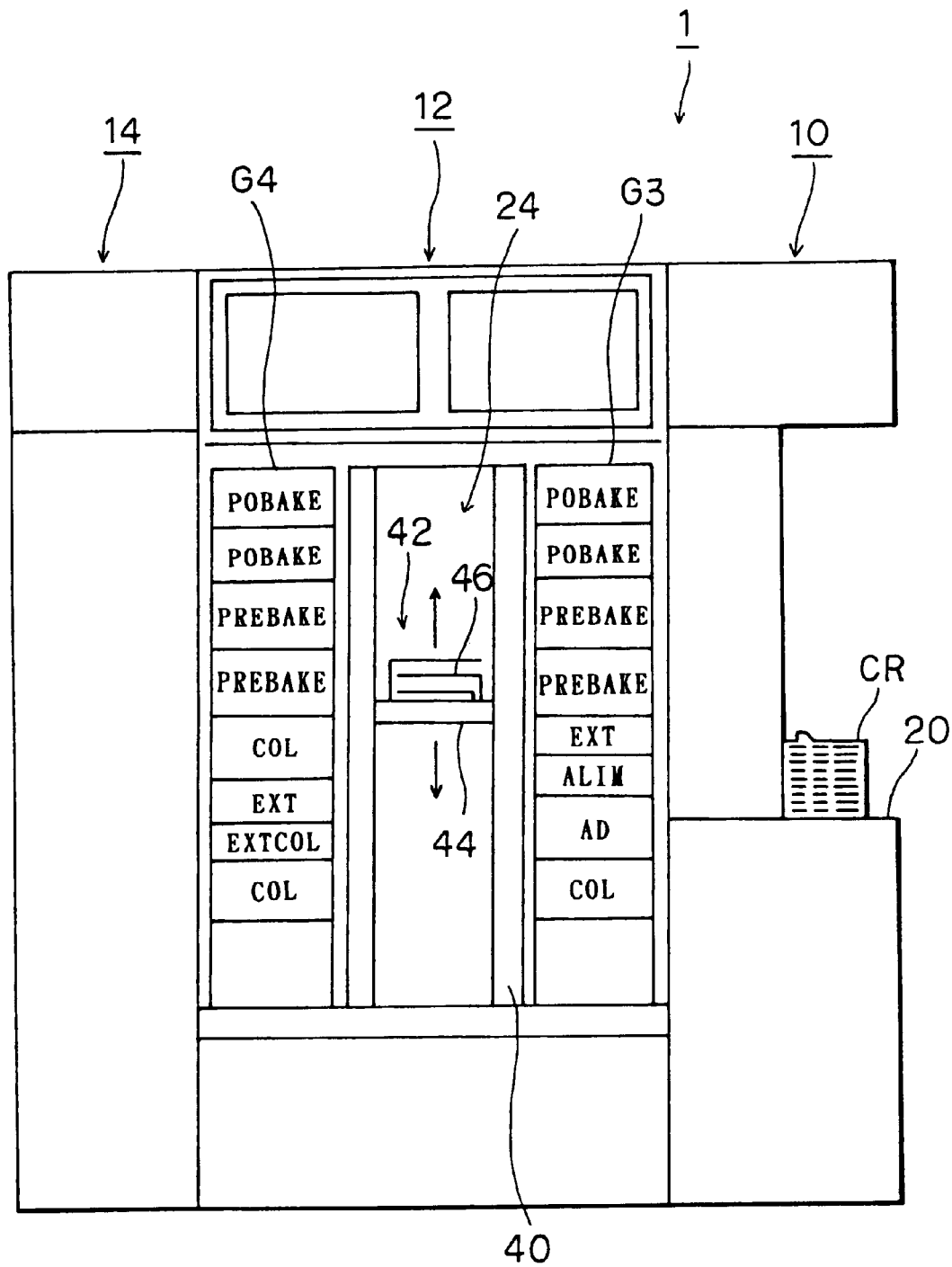
FIG. 3 is a rear view of the coating and developing system shown in FIG. 1.

As shown in FIG. 3, in the main wafer transfer mechanism 24, a wafer transfer device 42 is provided to be ascendable and descendable in a vertical direction (Z-direction) within a cylindrical supporting body 40. The cylindrical supporting body 40 is connected to a rotating shaft of a motor (not shown) and rotates on the rotating shaft integrally with the wafer transfer device 42 by rotating driving force of the motor. Thereby, the wafer transfer device 42 is rotatable in a θ-direction. Incidentally, the cylindrical supporting body 40 may be structured to connect to another rotating shaft (not shown) rotated by the above motor.

Provided in the wafer transfer device 42 are a plurality of holding members 46 movable in the longitudinal direction of a transfer base 44. The holding members 46 permit the delivery of the wafer W between respective processing units.

As shown in FIG. 1, five processing unit groups $G_1$, $G_2$, $G_3$, $G_4$, and $G_5$ can be arranged in the coating and developing system 1. It is possible that the first and second processing unit groups $G_1$ and $G_2$ each composed of multi-tiered units are arranged at the front side of the system, the third processing unit group $G_3$ of multi-tiered units is disposed adjacent to the mounting section station 10, the fourth processing unit group $G_4$ of multi-tiered units is disposed adjacent to the interface section 14, and that the fifth processing unit group $G_5$ of multi-tiered units is disposed at the rear side.

As shown in FIG. 3, in the third processing unit group $G_3$, oven-type processing units in which the wafer W is mounted on a holding table (SP shown in FIG. 1) to undergo predetermined processing, for example, a cooling unit (COL) for cooling processing, an adhesion unit (AD) for performing hydrophobic processing to improve fixedness of resist, the alignment unit (ALIM) for alignment, the extension unit (EXT), a prebaking unit (PREBAKE) for thermal processing before exposure processing, and a postbaking unit (POBAKE) for thermal processing after exposure processing are, for instance, eight-tiered from the bottom in order. Also in the fourth processing unit group $G_4$, oven-type processing units, for example, a cooling unit (COL), an extension and cooling unit (EXTCOL), an extension unit (EXT), a cooling unit (COL), a prebaking unit (PREBAKE), and a postbaking unit (POBAKE) are, for instance, eight-tiered from the bottom in order.

As described above, by arranging a cooling unit (COT) and an extension and cooling unit (EXTCOL) having a low processing temperature at the lower stage and a prebaking unit (PREBAKE), a postbaking unit (POBAKE), and an adhesion unit (AD) having a high processing temperature at the upper stage, the thermal mutual interference between units can be reduced. It is natural that random multistage arrangement is possible.

As shown in FIG. 1, the interface section 14 is the same as the process station 12 in a depth directional (X-directional) dimension but smaller than the process station 12 in a width directional (Y-directional) dimension. A transportable pickup-type wafer mounting section CR and a fixed buffer mounting section BR are two-tiered at the front of the interface section 14, and a peripheral aligner 28 is disposed at the back thereof.

In the central portion of the interface section 14, a wafer transfer device 26 is disposed. The wafer transfer device 26 moves in the X-direction and in the Z-direction to be accessible to both the mounting sections CR and BR, and the peripheral aligner 28.

The wafer transfer device 26 is also rotatable in the θ-direction to be accessible to the extension unit (EXT) arranged in the multi-tiered units of the fourth processing unit group $G_4$ on the process station 12 side and to a wafer delivery stand (not shown) on the adjacent aligner side.

In the coating and developing system 1, the multi-tiered units of the fifth processing unit group $G_5$ shown by the broken line in FIG. 1 can be also disposed on the rear side of the main wafer transfer mechanism 24 as described above. The multi-tiered units of the fifth processing unit group $G_5$ are movable in the Y-direction along guide rails 32. Accordingly, even when the multi-tiered units of the fifth processing unit group $G_5$ are provided as shown in the illustration, the multi-tiered units move along the guide rails 32, thereby securing a spatial portion. As a result, the maintenance operation for the main wafer transfer mechanism 24 can be easily carried out from the back thereof.

Figure 4:
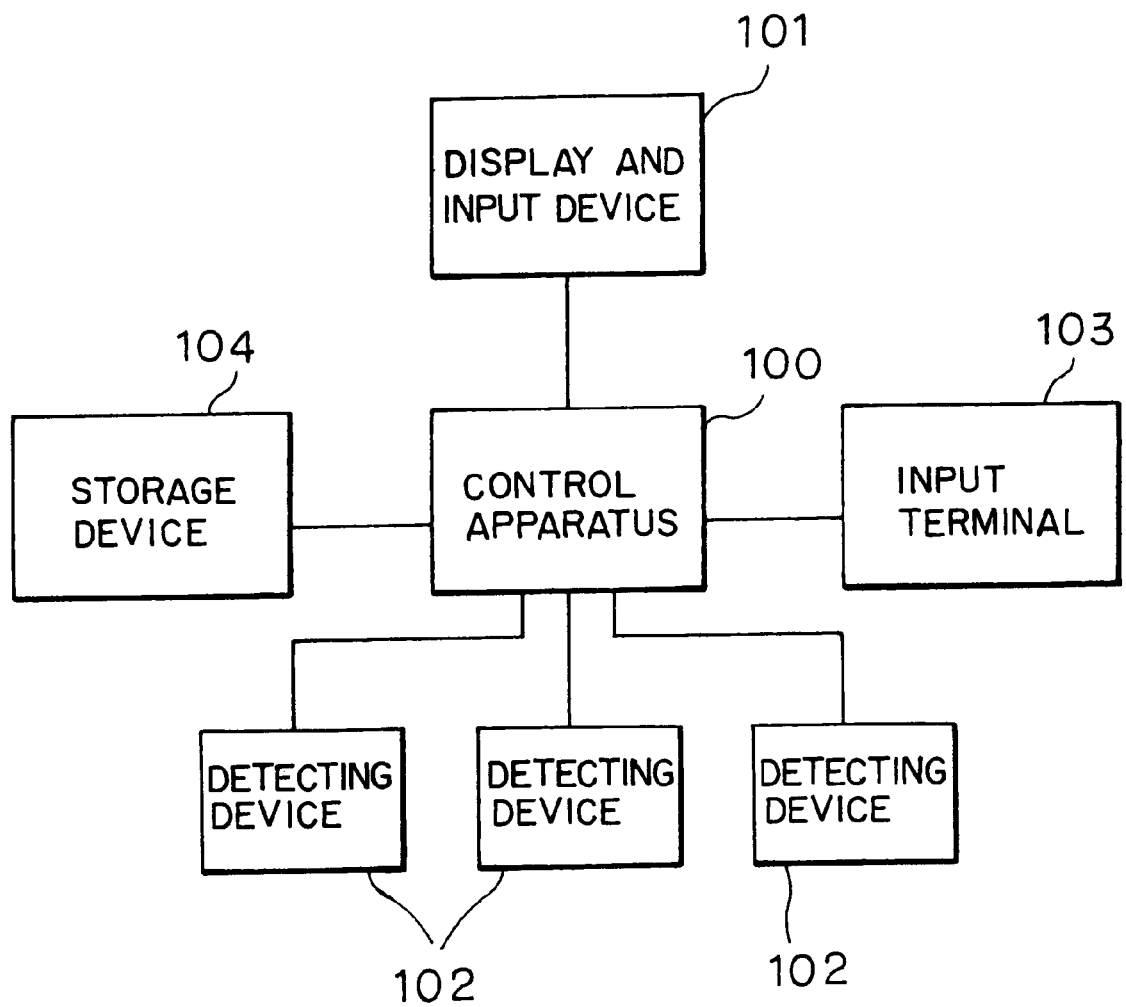
FIG. 4 is a block diagram showing the configuration of a control system of the coating and developing system shown in FIG. 1.

As shown in FIG. 4, in the coating and developing system 1, a display and input device 101 including a display device and an input device is connected to a control apparatus 100 for controlling each of the aforesaid sections. A plurality of detecting devices 102 for detecting whether the wafer W is normally processed or whether the wafer W is abnormally processed in each of the aforesaid sections are also connected to the control apparatus 100. The case where the wafer W is abnormally processed is when the supply of a solution is accidentally stopped in the resist coating unit or the developing unit, when the wafer is not mounted at the normal position in heating units such as the prebaking unit (PREBAKE) and the postbaking unit (POBAKE), or the cooling unit (COL), or the like. The control apparatus 100 includes an input terminal 103 for receiving notice of abnormal processing from the side of the aligner 13. In addition, a storage device 104 for storing each information outputted from the detecting device 102 or the input terminal 103 correspondingly to each of the wafers W housed in the collection mounting section.

Next, the basic operation of the coating and developing system 1 configured as above will be explained.

First, in the mounting section station 10, the wafer transfer mechanism 22 makes access to a wafer mounting section CR housing unprocessed wafers W out of wafer mounting sections CR mounted on the four mounting sections 20a to 20d which are arranged in a line in the X-direction with respective wafer transfer ports facing the side of the process station 12, and takes one wafer W out of the wafer mounting section CR. Thereafter, the wafer transfer mechanism 22 delivers the wafer W to the main wafer transfer mechanism 24 on the process station 12 side via the alignment unit (ALIM) and the like of the third processing unit group $G_3$.

The main wafer transfer mechanism 24 takes out the wafer W which has undergone orientation flat adjustment and centering in the alignment unit (ALIM) and carries the wafer W into the adhesion unit (AD) of the third processing unit group $G_3$ to apply hydrophobic processing thereto.

The wafer W which had undergone hydrophobic processing is carried into the predetermined prebaking unit (PREBAKE) by the main transfer mechanism 24 to be baked, and then carried into the predetermined cooling unit (COL) where the wafer W is cooled to a set temperature before resist coating processing, for example, 23° C.

When the cooling processing is completed, the wafer W is carried into the predetermined resist coating unit (COT) by the main wafer transfer mechanism 24, and the surface of the wafer W is coated with a resist in this resist coating unit (COT).

When the resist coating processing is completed, the main wafer transfer mechanism 24 takes the wafer W out of the resist coating unit (COT) and carries it again into the predetermined prebaking unit (PREBAKE) where the wafer W is heated at a predetermined temperature, for example, 100° C. for a predetermined time, thereby removing the remaining solvent by evaporation from a coating film on the wafer W.

Subsequently, the wafer W is carried into the extension and cooling unit (EXTCOL) by the main wafer transfer mechanism 24, where the wafer is cooled to a temperature suitable for the following step, that is, peripheral exposure processing by the peripheral aligner 28, for example, 24° C.

Thereafter, the wafer transfer device 26 provided in the interface section 14 takes the wafer W out of the extension and cooling unit (EXTCOL), and thereby the wafer W is delivered to the wafer transfer device 26.

Then, the wafer transfer device 26 carries the wafer W into the peripheral aligner 28 in the interface section 14. In the peripheral aligner 28, the wafer W undergoes exposure processing for the peripheral portion thereof.

When the peripheral exposure processing is completed, the wafer transfer device 26 carries the wafer W out of the peripheral aligner 28 and transfers it to the wafer delivery stand (not shown) on the adjacent aligner 13 side, in which case possibly the wafer W is temporarily housed in the buffer mounting section BR as required before being transferred to the aligner 13.

As described above, after the wafer W is transferred to the aligner 13, the wafer W undergoes exposure processing, for example, exposure processing using a reticle by the aligner 13. After the exposure processing for the entire surface of the wafer W in the aligner 13 is completed, the wafer W is delivered again to the wafer transfer device 26 in the interface section 14.

The wafer W is then transferred from the wafer transfer device 26 to the process station 12 side. In this case, the wafer W may be temporarily housed in the buffer mounting section BR in the interface section 14 as required before being transferred to the process station 12 side.

Thereafter, the main wafer transfer mechanism 24 in the process station 12 carries the received wafer W into the predetermined postbaking unit (POBAKE) where the wafer W is mounted on a hot plate to undergo baking processing for a predetermined time.

The baked wafer W is then carried into any of the cooling units (COL) by the main wafer transfer mechanism 24, where the wafer W is returned to an ordinary temperature. Subsequently, the wafer W is carried into the predetermined developing unit (DEV) by the main wafer transfer mechanism 24.

In the developing unit (DEV), the wafer W is mounted on the spin chuck, and by a spray method, for example, the resist on the surface of the wafer W is uniformly sprayed with a developing solution and developed. After development, a rinse solution is applied to the surface of the wafer W to rinse the developing solution. The wafer W is then rotated at a high speed to be dried.

Subsequently, the main wafer transfer mechanism 24 takes the wafer W out of the developing unit (DEV) and carries it again to the predetermined postbaking unit (POBAKE). In this postbaking unit (POBAKE), the wafer W is heated, for instance, at 100° C. for a predetermined time, thereby curing the resist swelled by development and improving chemical resistance.

When postbaking processing is completed, the main wafer transfer mechanism 24 carries the wafer W out of the postbaking unit and carries it into the predetermined cooling unit (COL) where cooling processing is applied thereto.

After the wafer W returns to an ordinary temperature, the main wafer transfer mechanism 24 transfers the wafer W to the mounting section station 10 side, and the wafer transfer mechanism 22 on the mounting section station 10 side puts the received wafer W into a predetermined wafer housing slot of the four wafer mounting sections CR mounted with respective wafer transfer ports facing the process station 12 side on the four mounting sections 20a to 20d arranged in a line in the X-direction on the mounting table 20.

Figure 5:
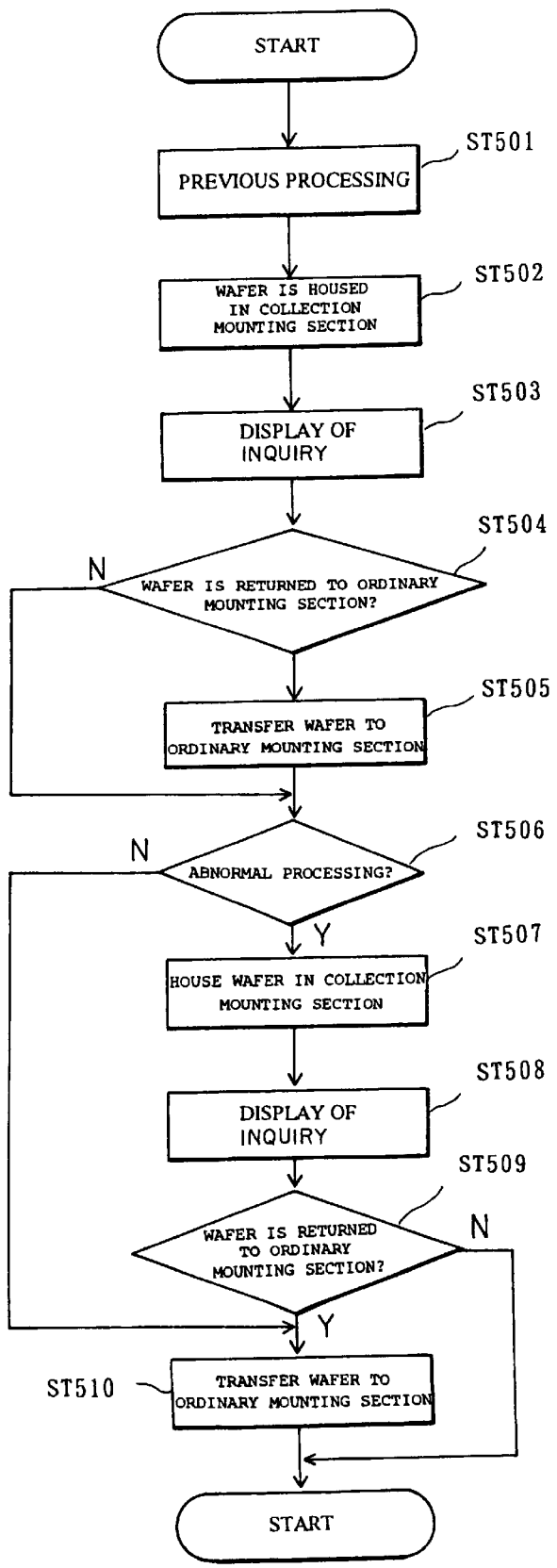
FIG. 5 is a flowchart showing an operation of the coating and developing system shown in FIG. 1.

The above is ordinary processing. In the coating and developing system 1 is performed previous processing in which several wafers W are tentatively processed prior to the aforesaid ordinary processing and in which it is confirmed whether or not the results of previous processing produce desired results as shown in FIG. 5 (step 501). The previously processed wafer W is housed in the collection mounting section mounted on the mounting section 20e via a course shown by A in FIG. 6 (step 502).

Subsequently, on the display and input device 101 is displayed an inquiry to select whether or not the wafer W housed in the collection mounting section is returned to the wafer mounting section CR mounted on one of the mounting sections 20a to 20d (step 503). When it is selected in the display and input device 101 that the wafer W is returned to the wafer mounting section CR mounted on one of the mounting sections 20a to 20d (step 504), the wafer W housed in the collection mounting section is transferred to the wafer mounting section CR mounted on one of the mounting sections 20a to 20d as shown by the course B in FIG. 6 by means of the wafer transfer mechanism 22 (step 505). Incidentally, C in FIG. 6 shows the course of the ordinarily processed wafer W.

Figure 6:
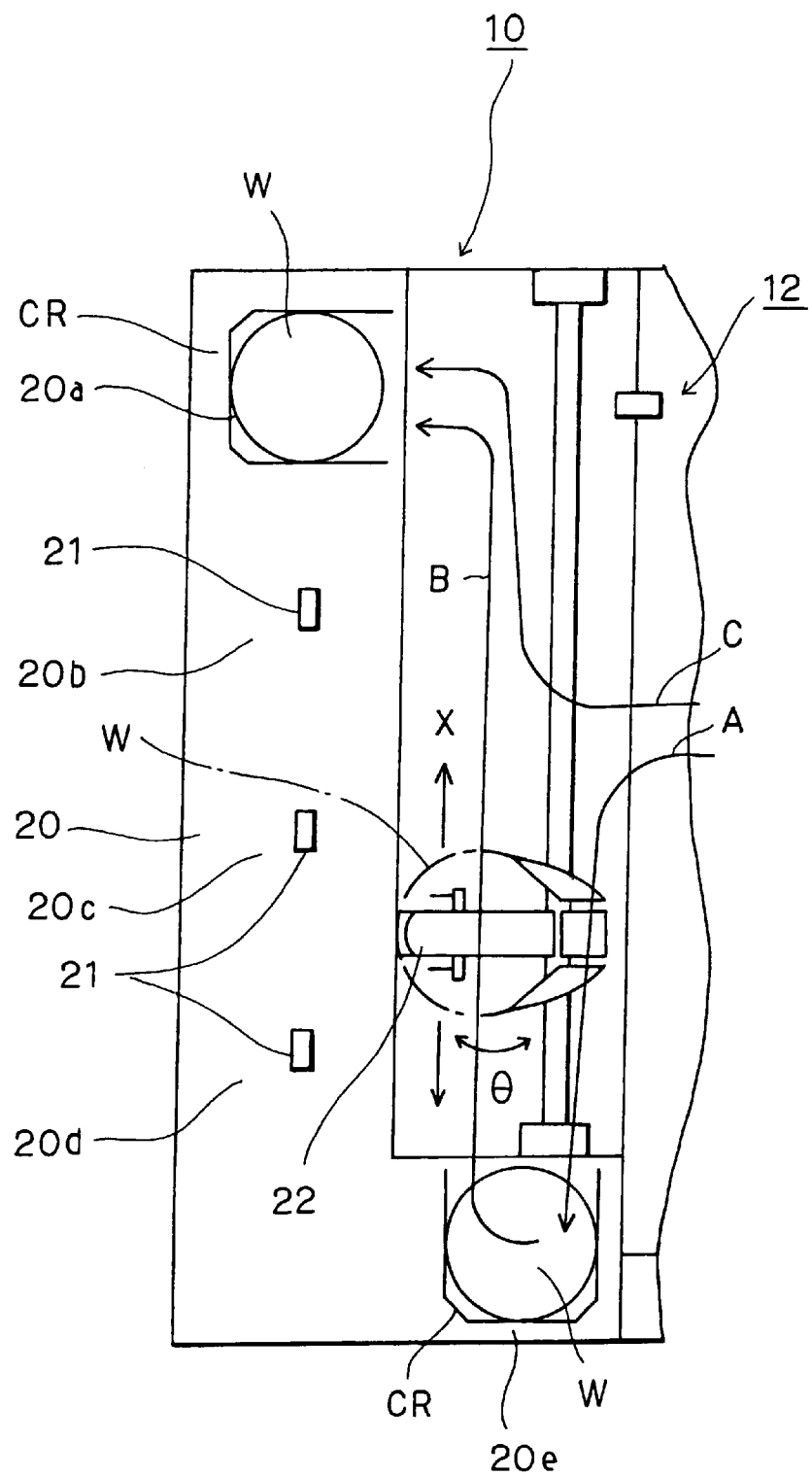
FIG. 6 is an explanatory view showing the operation of the coating and developing system shown in FIG. 1.

Thereafter, when the control apparatus 100 receives information on the occurrence of an abnormality from the detecting element 102 or the input terminal 103 after ordinary processing has started (step 506), the abnormally processed wafer W is housed in the collection mounting section mounted on the mounting section 20e via the course shown by A in FIG. 6 (step 507).

On the display and input device 101, information stored in the storage device 104, that is, each information outputted from the detecting device 102 or the input terminal 103 correspondingly to each of the wafers W housed in the collection mounting section is displayed, and an inquiry to select whether or not the wafer W housed in the collection mounting section is returned to the wafer mounting section CR mounted on one of the mounting sections 20a to 20d is also displayed (step 508). When it is selected in the display and input device 101 that the wafer W is returned to the wafer mounting section CR mounted on one of the mounting sections 20a to 20d (step 509), the wafer W housed in the collection mounting section is transferred to the wafer mounting section CR mounted on one of the mounting sections 20a to 20d as shown by the course B in FIG. 6 by means of the wafer transfer mechanism 22 (step 510).

It should be mentioned that when an abnormality in processing occurs, continuous occurrence of an abnormality in processing can be prevented by raising an alarm from the display and input element 101, a speaker, or the like and by stopping the processing of the entire system 1.

As described above, the coating and developing system 1 is structured to once house the previously processed wafer W and the abnormally processed wafer W in the collection mounting section, whereby the abnormally processed wafer W can be exactly taken out and subjected to inspection and the like, and the wafer W processed previous to ordinary processing can be exactly taken out and subjected to inspection and the like, and can be then returned to the original mounting section at an user's discretion, thus saving time and labor for returning these wafers when these wafers are handled similarly to the ordinarily processed wafer W.

The present invention is not limited to the aforesaid embodiment.

Figure 7:
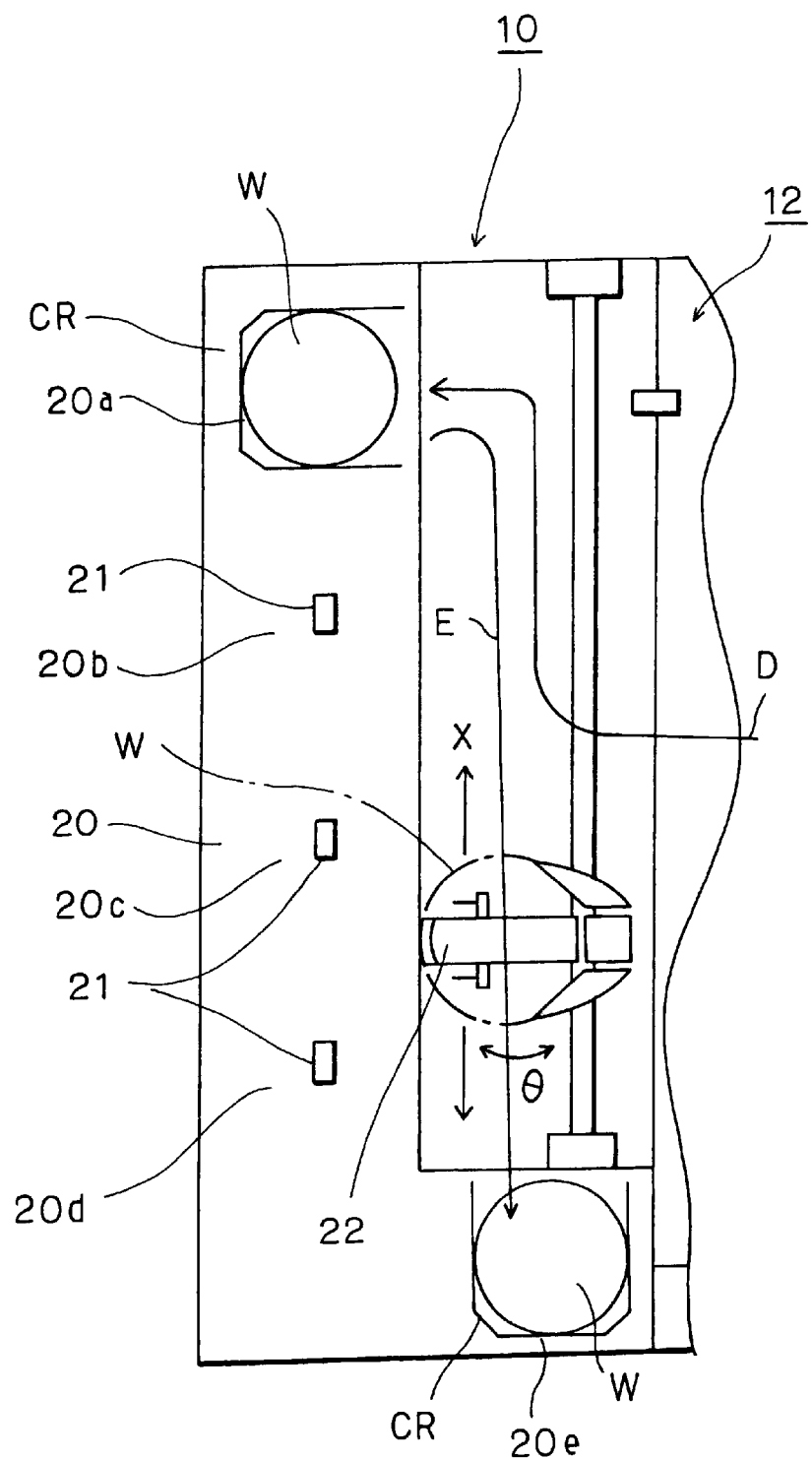
FIG. 7 is an explanatory view showing an operation of a coating and developing system according to another embodiment of the present invention.

For example, it is possible that all the previously processed wafer W and the abnormally processed wafer W similarly to the ordinarily processed wafer W are once housed in the wafer mounting section CR mounted on one of the mounting sections 20a to 20d as shown by the course D in FIG. 7 and thereafter housed in the collection mounting section mounted on the mounting section 20e at user's discretion as shown by the course E in FIG. 7. Further, it is possible that the wafer W housed in the collection mounting section mounted on the mounting section 20e as described above is housed again in the wafer mounting section CR mounted on one of the mounting sections 20a to 20e at user's discretion.

The present invention is not limited to the aforesaid embodiments but can be embodied in various forms. For example, a substrate is not limited to the wafer W. An LCD substrate, a glass substrate, a CD substrate, a photomask, a print substrate, a ceramic substrate, and the like are also available.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims. The Japanese patent application 10-195580 is hereby incorporated by reference including the entire specification and all drawings.

What is claimed is:

1. An apparatus for processing a substrate, comprising:
   a first mounting section housing a plurality of substrates before and after processing;
   a process section processing the substrate;
   a second mounting section housing a plurality of the substrates abnormally processed in said process section before inspection of the cause of abnormality;

means for transferring the substrate between said first mounting section, said process section, and said second mounting section.

2. The apparatus as set forth in claim 1, further comprising:
means for detecting whether the substrate is normally processed in said process section or whether the substrate is abnormally processed therein;
means for causing said transfer means to transfer the substrate from said process section to said first mounting section when normal processing is detected by said detecting means, and for causing said transfer means to transfer the substrate from said process section to said second mounting section when abnormal processing is detected by said detecting means;
means for inputting a command whether or not the substrate is transferred from said second mounting section to said first mounting section by said transfer means; and
means for causing said transfer means to transfer the substrate from said second mounting section to said first mounting section based on the command inputted by said input means.

3. The apparatus as set forth in claim 2, further comprising:
means for reporting abnormal processing when the abnormal processing is detected by said detecting means.

4. The apparatus as set forth in claim 2, further comprising:
means for stopping substrate processing in said process section when abnormal processing is detected by said detecting means.

5. The apparatus as set forth in claim 2, further comprising:
means for outputting information on abnormal processing when the abnormal processing is detected by said detecting means; and
means for storing each of the outputted information correspondingly to each of the substrates housed in said second mounting section.

6. The apparatus as set forth in claim 1, wherein said second mounting section houses a substrate processed previous to ordinary processing in said process section together with the substrate abnormally processed in said process section.

7. The apparatus as set forth in claim 6, further comprising:
means for causing said transfer means to transfer the previously processed substrate from said process section to said second mounting section;
means for inputting a command whether or not the previously processed substrate is transferred from said second mounting section to said first mounting section by said transfer means; and
means for causing said transfer means to transfer the previously processed substrate from said second mounting section to said first mounting section based on the command inputted by said input means.

8. The apparatus as set forth in claim 1, further comprising:
means for detecting whether the substrate is normally processed in said process section or whether the substrate is abnormally processed therein;
means for causing said transfer means to transfer the substrate normally processed and the substrate abnormally processed in said process section from said process section to said first mounting section;
means for inputting a command whether or not the substrate abnormally processed in said process section out of the substrates housed in said first mounting section is transferred from said first mounting section to said second mounting section by said transfer means; and
means for causing said transfer means to transfer the substrate abnormally processed in said process section from said first mounting section to said second mounting section based on the command inputted by said input means.

9. The apparatus as set forth in claim 8, further comprising:
means for outputting information on abnormal processing when the abnormal processing is detected by said detecting means; and
means for storing at least each of the outputted information correspondingly to each of the substrates abnormally processed in said process section out of the substrates housed in said first mounting section.

10. An apparatus for processing a substrate, comprising:
a first mounting section housing a plurality of substrates before and after processing;
a process section processing the substrate;
a second mounting section housing a plurality of the substrates processed previous to ordinary processing in said process section before inspection of the condition of the previously processed substrates; and
means for transferring the substrate between said first mounting section, said process section, and said second mounting section.

11. A method for processing a substrate, comprising the steps of:
transferring a substrate from a first mounting section housing a plurality of substrates to a processing section for processing the substrate;
processing the substrate in the process section;
detecting whether the substrate is normally processed in the process section or whether the substrate is abnormally processed therein;
transferring the substrate from the process section to the first mounting section when normal processing is detected and transferring the substrate from the process section to a second mounting section housing a plurality of substrates before inspection of the cause of abnormality;
inputting a command whether or not the substrate housed in the second mounting section is transferred to the first mounting section; and
transferring the substrate housed in the second mounting section to the first mounting section based on the inputted command.

12. The method as set forth in claim 11, further comprising the steps of:
processing a substrate previous to ordinary processing in the process section; and
transferring the previously processed substrate from the process section to the second mounting section.

13. The method as set forth in claim 12, further comprising the steps of:
inputting a command whether or not the previously processed substrate is transferred from the second mounting section to the first mounting section; and transferring the previously processed substrate from the second mounting section to the first mounting section based on the inputted command.

14. A method for processing a substrate, comprising the steps of:

transferring a substrate from a first mounting section housing a plurality of substrates to a process section for processing the substrate;

processing the substrate in the process section;

detecting whether the substrate is normally processed in the process section or whether the substrate is abnormally processed therein;

transferring the normally processed substrate and the abnormally processed substrate to the first mounting section;

inputting a command whether at least the substrate whose abnormality is detected out of the substrates housed in the first mounting section is transferred from the first mounting section to a second mounting section housing a plurality of substrates; and transferring the substrates housed in the first mounting section to the second mounting section based on the inputted command before inspection of the cause of abnormality.

15. A method for processing a substrate, comprising the steps of:

transferring a substrate from a first mounting section housing a plurality of substrates to a process section for processing the substrate;

processing the substrate in the process section;

processing a substrate previous to ordinary processing in the process section;

transferring the previously processed substrate from the process section to a second mounting section housing a plurality of substrates before inspection of the condition of the previously processed substrates;

inputting a command whether or not the substrate housed in the second mounting section is transferred to the first mounting section; and transferring the substrate housed in the second mounting section to the first mounting section based on the inputted command.

16. A method for processing a substrate, comprising the steps of:

transferring a substrate from a first mounting section housing a plurality of substrates to a process section for processing the substrate;

processing the substrate in the process section;

processing a substrate previous to ordinary processing in the process section;

transferring the ordinarily processed substrate and the previously processed substrate to the first mounting section;

inputting a command whether at least the previously processed substrate out of the substrates housed in the first mounting section is transferred from the first mounting section to a second mounting section housing a plurality of substrates; and transferring the substrate housed in the first housing section tot he second housing section based on the inputted command before inspection of the condition of the previously processed substrates.

* * * * *